United States Patent [19]

Kuroda et al.

[11] Patent Number: 5,331,204
[45] Date of Patent: Jul. 19, 1994

[54] INTEGRATED CIRCUIT PACKAGE IN WHICH IMPENDANCE BETWEEN SIGNAL PADS AND SIGNAL LINES IS MATCHED BY REDUCING THE SIZE OF A GROUND PLANE

[75] Inventors: Masao Kuroda; Ryuji Imai; Toshiya Asano, all of Aichi, Japan

[73] Assignee: NGK Spark Plug Co., Ltd., Aichi, Japan

[21] Appl. No.: 962,419

[22] Filed: Oct. 19, 1992

[30] Foreign Application Priority Data

Oct. 17, 1991 [JP] Japan .................... 3-269333

[51] Int. Cl.[5] ............... H01L 23/48; H01L 29/46; H01L 23/02; H01L 39/02
[52] U.S. Cl. ..................... 257/758; 257/700; 257/701; 257/734; 257/750; 257/752
[58] Field of Search ............ 257/700, 701, 734, 750, 257/752, 754, 758

[56] References Cited

U.S. PATENT DOCUMENTS

| | | | |
|---|---|---|---|
| 4,705,917 | 11/1987 | Gates, Jr. et al. | 174/52 FP |
| 5,008,734 | 4/1991 | Dutta et al. | 357/74 |
| 5,198,693 | 3/1993 | Imken et al. | 257/720 |

OTHER PUBLICATIONS

"A Multi-chip Packaged CaAs 16×16 Bit Parallel Multipler," T. Sekiguchi et al., Optoelectronics Laboratories, Jul. 30, 1990, pp. 1-4.

The International Journal for Hybrid Microelectronics, Special Issue on the 1981 International Microelectronics Symposium, vol. 4, No. 2, Oct., 1981, pp. 289-295.

"Analysis of Characteristics of the Shielded-Coplanar Waveguide by Conformal Mapping Method," Y. Nougchiii et al., vol. J60-B, No. 8, Aug. 1977, pp. 561-566.

Primary Examiner—Sara W. Crane
Assistant Examiner—Valencia M. Wallace
Attorney, Agent, or Firm—Finnegan, Henderson, Farabow, Garrett & Dunner

[57] ABSTRACT

An object of the present invention is to match impedance of each portion of whole lines of a signal wiring with the integrated circuit mounted on the package. All ground planes are deleted within a region vertically under/above a connection pad provided on the top- or bottom-surface of a polyimide multilayer part, whereby no capacitance is generated between the connection pad and the ground planes, so that the impedance of the signal wiring within the region right under/above the connection pad is prevented from being lowered.

3 Claims, 3 Drawing Sheets

INTEGRATED CIRCUIT PACKAGE IN WHICH IMPENDANCE BETWEEN SIGNAL PADS AND SIGNAL LINES IS MATCHED BY REDUCING THE SIZE OF A GROUND PLANE

BACKGROUND OF THE INVENTION

The present invention relates to an integrated circuit package in which signal wirings and ground planes (or ground meshes) are formed. And, the signal wirings or the ground planes alternate with laminal insulation layers.

For example, in high density multilayer wiring substrate, copper-polyimide multilayer part formed on a ceramic substrate is constituted by a plurality of laminal insulating layers of polyimide resin, and signal wirings, ground meshes, etc. are laminated alternatively with them. In order to improve the signal transfer characteristics, it is desired that impedance of the signal wirings formed inside such a multilayer part shall be matched with impedance of integrated circuit mounted on the substrate.

Conventionally, therefore, the mismatching of impedance of the signal wirings has been prevented from occurring by providing signal wirings between ground planes.

However, the present inventor found that comparatively large capacitance is generated between a conductor pad and a ground plane if the conductor pad having an inner size five or more times as large as the width of a signal wiring is provided on the top- or bottom-surface of a multilayer part, or inside the multilayer part so that the impedance of the signal wiring is lowered at the place in which this capacitance is generated.

That is, there has been a problem that the impedance of the signal wirings disposed within a region under-/above a conductor pad are lowered locally, and as the result, the impedance mismatching occurs. On the other hand, if the inner size of the conductor pad is selected to be less than five folds of the width of a signal wiring lying within the region vertically under/above the conductor pad, the influence of capacitance between the pad and ground planes is small and therefore the disorder of impedance of the signal wirings is well small.

SUMMARY OF THE INVENTION

It is an object of the present invention to provide an integrated circuit package in which impedance at each portion of the whole signal wirings can be matched with integrated circuit mounted on it.

According to an aspect of the invention, there is provided than an integrated circuit package comprises a multilayer part in which a plurality of signal wiring layers and ground planes (or ground meshes) are laminated alternately with insulating layers.

Further, when a width of the signal wiring layers existing within a region vertically under/above a conductor pad in the multilayer part is represented by W and an inner size of the conductor pad is selected to be not less than 5 W, an area G of the ground planes existing within the region under/above the conductor pad is selected to be not larger than an area P of an inner width W extending all over the circumference of the conductor pad.

According to the present invention, the multilayer part does not have the ground planes within the region vertically under/above a part of the conductor pad obtained by removing the width W from the circumference of the conductor pad.

The ground planes are deleted completely or partially within the region vertically under/above the conductor pad, whereby the generation of capacitance between the conductor pad and the ground planes can be suppressed in comparison with conventional structures. As a result, it is possible to prevent the impedance of the signal wirings within the region vertically under-/above the conductor pad from lowering.

As mentioned above, in the integrated circuit package according to the present invention, the impedance of signal wirings within a region under/above a conductor pad can be prevented from lowering so that it is possible to make impedance matching over each portion of the whole signal wirings.

DETAILED DESCRIPTION OF THE PREFERRED EMBODIMENTS

Figure 1:
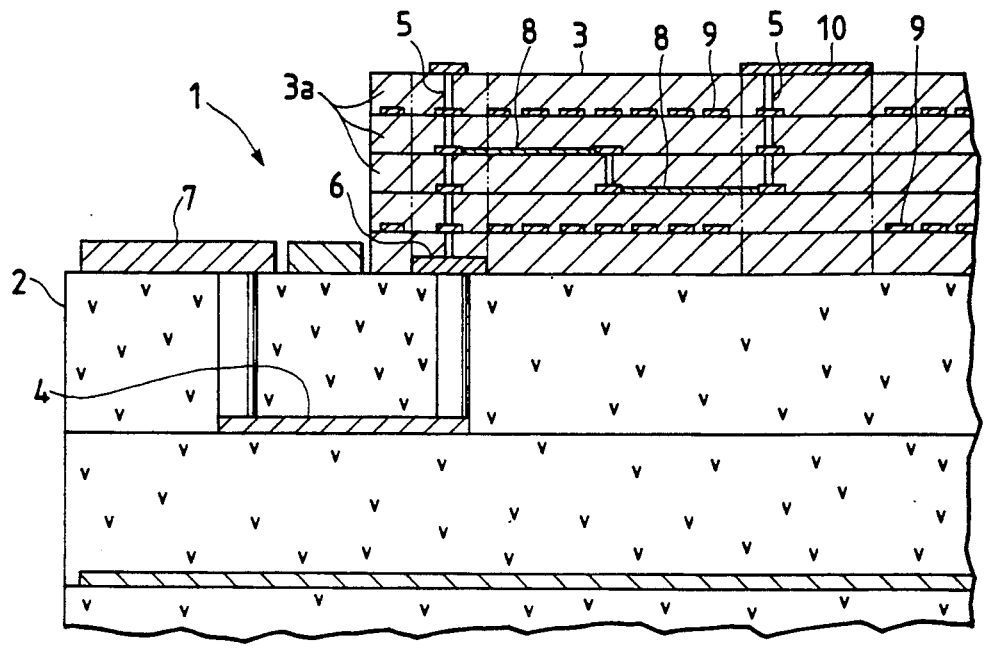
FIG. 1 is a cross-sectional view of an integrated circuit package.

An integrated circuit package according to the present invention will be described with respect to an embodiment illustrated in the drawings.

Figure 2:
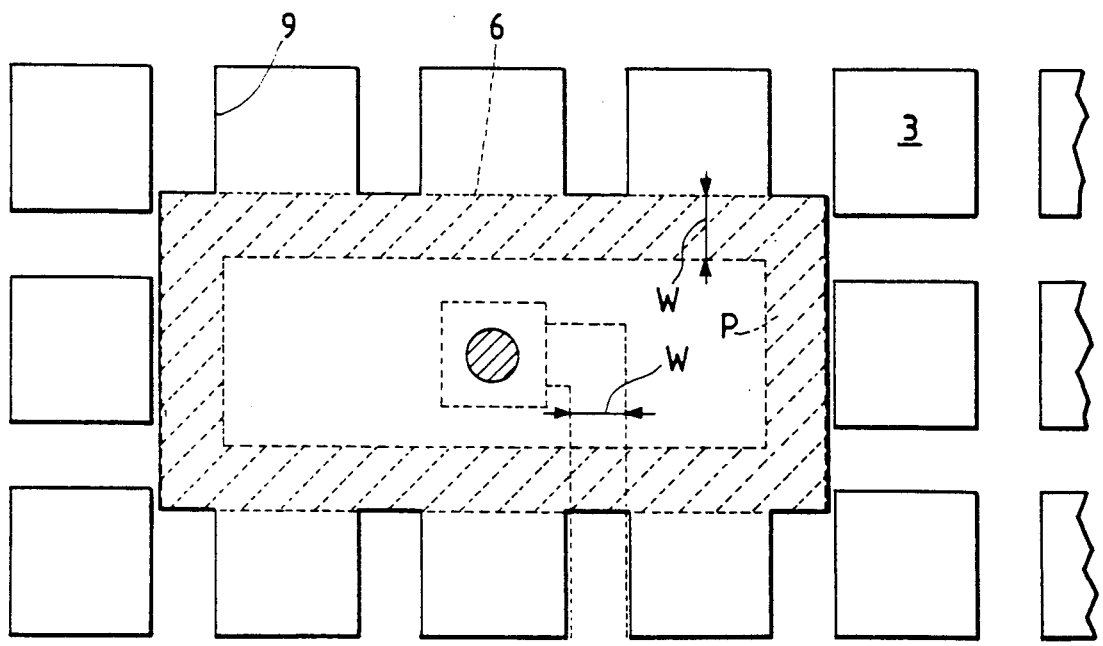
FIG. 2 is a sectional view of a main portion of a polyimide multilayer part, as the first embodiment of the present invention.
Figure 3:
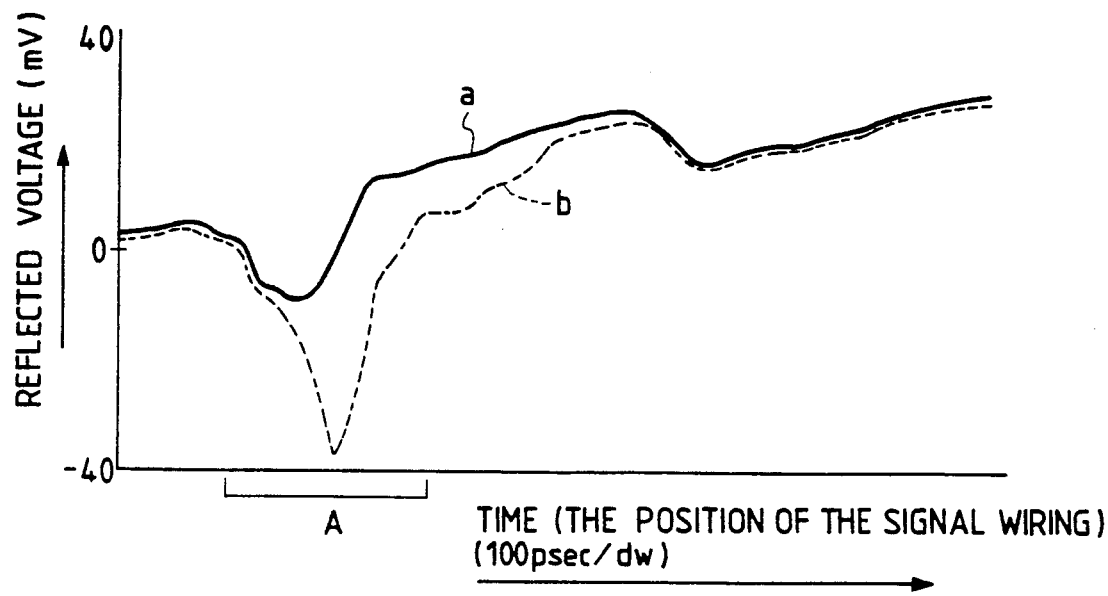
FIG. 3 is a graph illustrating the impedance of a signal wiring.

FIGS. 1 to 3 show an embodiment of the present invention: FIG. 1 is a cross-sectional view of an integrated circuit package, and FIG. 2 is a sectional view of a main portion of the polyimide multilayer part.

An integrated circuit package 1 includes a ceramic insulating substrate 2 and a copper-polyimide multilayer part 3 formed on the surface of the ceramic insulating substrate 2. An integrated circuit (not-shown) is mounted on the surface of the copper-polyimide multilayer part 3.

The ceramic insulating substrate 2 is a multi-layer wiring substrate made of an insulating material such as alumina, aluminum nitride, mullite, or the like. Specially, for example, a substrate wiring 4 is printed on a green sheet made of alumina as a main material. Next, a plurality of such green sheets are laminated, and burnt at a high temperature in a hydrogen furnace of a wetted atmosphere to form a multi-layer wiring substrate.

A conductive connection pad 6 (a conductor pad according to the present invention) to be connected to a conductor via 5 in the copper-polyimide multilayer part 3 is formed on the surface of the ceramic insulating substrate 2. The connection pad 6 is provided large enough so as to be connected to the conductor via 5 surely even if a dimensional error occurs because of the burning the ceramic. The connection pad 6 is electrically connected through the wirings 4 inside the ceramic insulating substrate 2 to a lead connection pad 7 formed on the surface without polyimide multilayer of the ceramic insulating substrate 2. An external lead (not shown) is brazed to the lead connection pad 7.

The copper-polyimide multilayer part 3 is a wiring layer according to the present invention, which is constituted by a plurality of laminal insulating layers 3a of polyimide resin having a low dielectric constant. A signal wirings 8, a mesh ground plane 9, and so on are formed on the surface of each of the insulating layers 3a in the polyimide multilayer part 3. The signal wiring 8 has one end connected to the conductor via 5 passing through the copper-polyimide multilayer part 3 and the other end connected to a bonding pad 10 formed on the surface of the copper-polyimide multilayer part 3. The bonding pad 10 is also a conductor pad according to the present invention, and is connected to the integrated circuit through a not-shown bonding wire. On the other hand, the ground plane 9 is grounded at a not-shown position.

The signal wirings 8 are provided so as to exist within a region vertically under/above the ground planes 9. This is for the purpose of matching the impedance of the signal wirings 8 with the impedance of the integrated circuit by means of the upper- and lower-side ground layers 9. The above-mentioned "grounded" means "AC grounded", and the ground planes 9 may be used not only as ground but also as power supplier.

In the case where the inner size of a conductor pad such as the connection pad 6 or the bonding pad 10 provided on the top- or bottom-surface of the copper-polyimide multilayer part 3 is selected to be five or more times as large as the signal wiring width W in the vertical direction of the conductor pad (in the case where the shorter side of the conductor pad is not less than 5 W), all the ground planes 9 within a region vertically under/above the conductor pad are deleted (reference be made to FIG. 2).

Consequently, no ground plane 9 exists within the region vertically under/above a conductor pad such as the connection pad 6 or the bonding pad 10. That is, the area of the ground planes 9 within the region vertically under/above the conductor pad (connection pad 6) is made substantially zero. In short, let the wire width of the signal wiring 8 within the region vertically under/above a conductor pad be W and let the area of the inner width W all over the entire circumference of the conductor pad be P (reference be made to the portion hatched with broken lines in FIG. 2), then the area G of the ground plane 9 lying within the region vertically under/above the conductor pad is zero and, that is, not larger than the area P.

Next, a copper-polyimide multilayer part 3 having the above-mentioned structure was prepared, and the impedance of signal wiring 8 in the vicinity of a connection pad 6 in the part 3 was measured at a lead connection pad 7 by a TDR method. The result of measurement is shown by the solid line (a) in FIG. 3.

For the purpose of reference, a copper-polyimide multilayer part having a conventional structure, in which ground planes within a region vertically under/above a conductor pad (connection pad) are not eliminated, was prepared, and the impedance of a signal wiring was measured by the TDR method. The result of measurement is shown by the broken line (b) in FIG. 3. In FIG. 3, the axis of abscissa indicates time (the measuring point of the signal wiring 8), and the axis of ordinate indicates the reflected voltage of the signal wiring 8. The impedance $Z_0$ of the signal wiring 8 is calculated according to the following expression.

$$Z_0 = Z_{in}(1+\rho)/(1-\rho)$$

where $\rho$ = (reflected voltage)/(input voltage), and $Z_{in}$ represents the impedance of a measurement system. As for an input pulse wave of a measuring equipment, the rise time is 35 psec, and the input pulse voltage is 200 mV.

As shown by the broken line (b) in FIG. 3, the copper-polyimide multilayer part (according to the conventional technology) in which ground planes within a region vertically under/above a conductor pad (connection pad) are not deleted suffers from the influence of the capacitance between the conductor pad (connection pad) and the ground planes so that the impedance of signal wirings (the portion indicated by A in FIG. 3) lying within the region vertically under/above the conductor pad becomes low extremely.

In the copper-polyimide multilayer part according to the present invention in which the ground planes 9 within a region vertically under/above a conductor pad (connection pad 6) are eliminated, on the contrary, no capacitance is produced between the conductor pad (connection pad 6) and the ground planes 9 even if the inner size of the conductor pad is selected to be five or more times as large as the signal wiring width W. Therefore, as shown by the solid line (a) in FIG. 3, the impedance of the signal wiring 8 lying within the region vertically under/above the conductor pad (the portion indicated by A in FIG. 3) is prevented from lowering to make it possible to set the impedance to a desired value. That is, the distortion of the TDR waveform can be made small, and the reflected noise can be reduced on a large scale.

As has been described above, by means that the ground planes 9 within the region vertically under/above a conductor pad are deleted, it is possible to match the impedance all over the signal wiring 8 with the integrated circuit and to improve the signal transfer characteristic.

Figure 4:
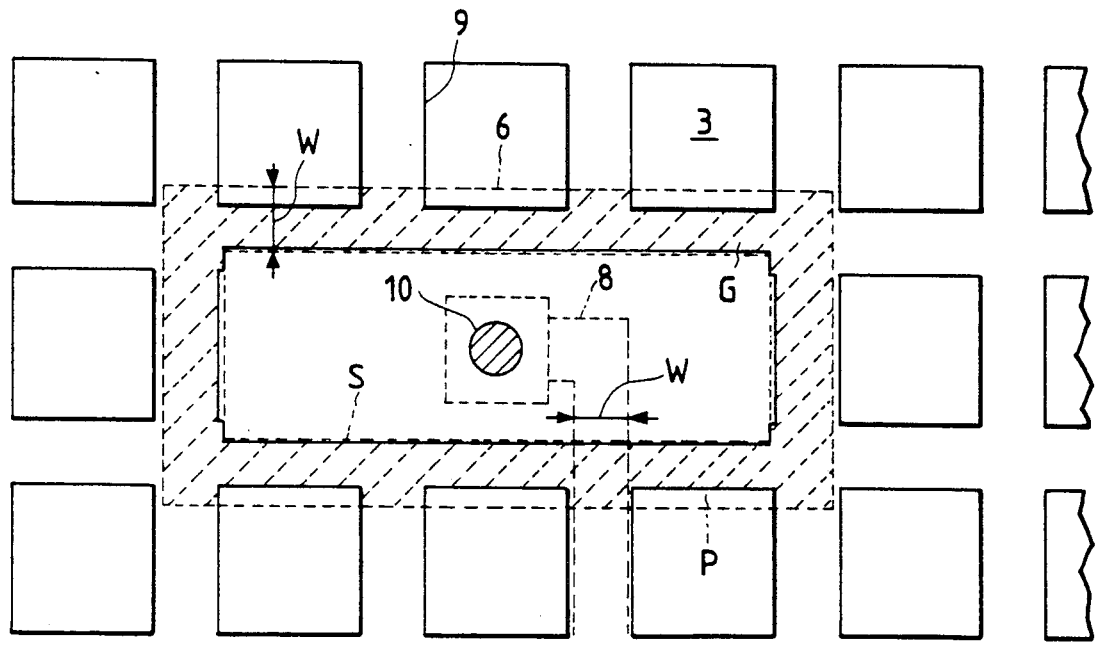
FIG. 4 is a sectional view of a main portion of a copper-polyimide multilayer part, as the second embodiment of the present invention.

FIG. 4 is a sectional view of a main portion of a copper-polyimide multilayer part 3, showing a second embodiment of the present invention.

In the first-mentioned embodiment, all the ground planes 9 within the region vertically under/above a conductor pad (which is a connection pad 6 in the drawing) are deleted in the above mentioned embodiment. According to this second embodiment, however, all the ground planes 9 within a region vertically under/above a part of the connection pad 6 which is obtained by removing the width W (the same width as one of a signal wiring 8) from each outer side of the circumference of the connection pad 6 are deleted, and the influence of capacitance produced between the ground planes 9 and the connection pad 6 is permitted as an error.

When the width of the signal wiring 8 within a region vertically under/above the connection pad 6 is represented by W, and the area of the inner width W extending all over the circumference of the connection pad 6 is represented by P, the area G of the ground plane 9 lying within the region vertically under/above the connection pad 6 is smaller than the area P as indicated by hatching with broken lines in FIG. 4.

Figure 5:
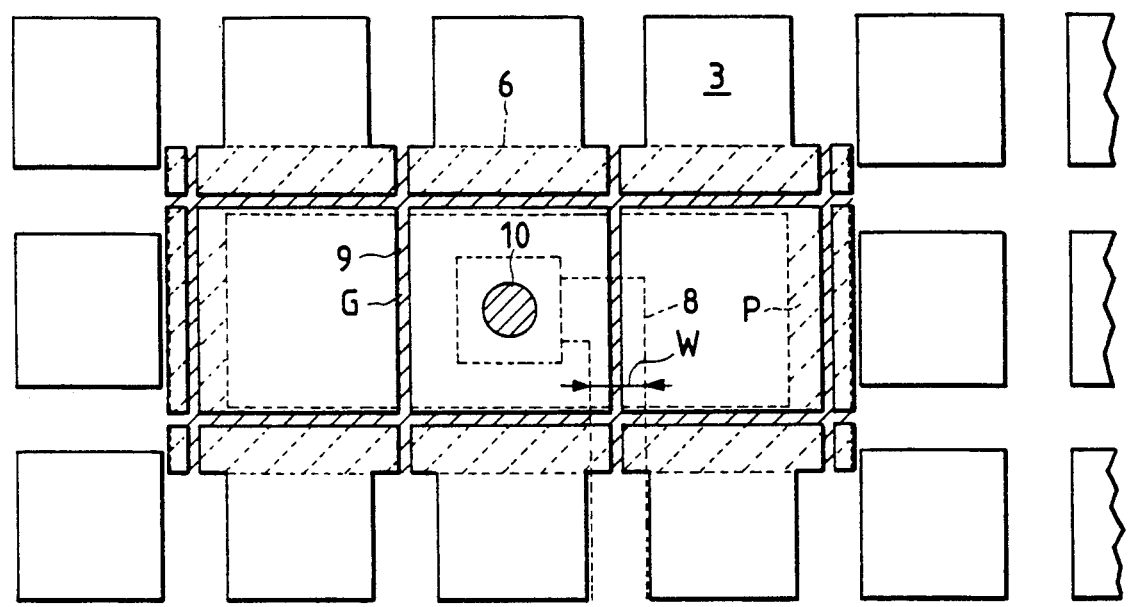
FIG. 5 is a sectional view of a main portion of a copper-polyimide multilayer part, as the third embodiment of the present invention.

FIG. 5 is a sectional view of a main portion of a copper-polyimide multilayer part 3, showing a third embodiment of the present invention.

According to this embodiment, the width of a ground mesh 9 within a region vertically under/above a conductor pad (which is a connection pad 6 in the drawing)

is selected to be narrower than the other portions so that the area G of the mesh ground plane 9 lying within the region vertically under/above the connection pad 6 is smaller than the area P of the inner width W extending all over the circumference of the connection pad 6.

Although the present invention is applied to a copper-polyimide multilayer part constituted by plurally laminated copper-polyimide layers in the above-mentioned embodiments, the present invention may be applied to a wiring substrate constituted by other resin layers (for example, SiO$_2$, benzocyclobutene (BCB) and so on), a substrate constituted by glass materials, a substrate constituted by ceramic materials, and so on. As for conductor, not only copper but also another conductive material (for example, Au, Al, Ag, and so on) are available.

The form of the integrated circuit package shown in the embodiments is only for describing the present invention, and the present invention can be applied to any integrated circuit package formed by laminal insulating layers other than the form of such an integrated circuit package.

What is claimed is:

1. An integrated circuit package comprising:
   a multilayer part including:
   a plurality of wiring layers each having a plurality of signal lines;
   a pair of ground layers;
   a conductor pad; and
   a plurality of insulating layers through which said wiring layers and said ground layer are laminated,
   wherein an inner size of the conductor pad is selected to be not less than five times as large as a trace width of the signal lines in the plurality of wiring layers, said inner size being the maximum diameter of an inscribing circle in an outline of the conductor pad, and
   wherein an area defined by the pair of ground layers and existing in a vertical direction from the conductor pad is not larger than a region defined by extending a width of the signal lines over a circumference of the conductor pad.

2. An integrated circuit package as claimed in claim 1, wherein there is no ground layer in a region defined by vertically extending the portion of the conductor pad that does not include the region defined by extending a width of the signal lines over a circumference of the conductor pad.

3. An integrated circuit package as claimed in claim 1, wherein each insulating layer includes one of said wiring layers, said ground layers, and said conductor pad.

* * * * *